(12) United States Patent
Johnson et al.

(10) Patent No.: US 7,228,472 B2
(45) Date of Patent: Jun. 5, 2007

(54) SYSTEM AND METHOD TO CONTROL DATA CAPTURE

(75) Inventors: Tyler J. Johnson, Murphy, TX (US); Ryan Lee Akkerman, Allen, TX (US); John A. Benavides, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 377 days.

(21) Appl. No.: 11/032,928

(22) Filed: Jan. 11, 2005

(65) Prior Publication Data

US 2006/0156102 A1 Jul. 13, 2006

(51) Int. Cl.
G01R 31/28 (2006.01)
G06F 12/00 (2006.01)

(52) U.S. Cl. ...................... 714/724; 711/100

(58) Field of Classification Search .................. None
See application file for complete search history.

(56) References Cited

U.S. PATENT DOCUMENTS

| | | | |
|---|---|---|---|
| 4,791,356 A | 12/1988 | Warren et al. | |
| 5,850,512 A | 12/1998 | Song | |
| 5,880,671 A | 3/1999 | Ranson et al. | |
| 5,881,224 A | 3/1999 | Ranson et al. | |
| 5,956,476 A | 9/1999 | Ranson et al. | |
| 5,956,477 A | 9/1999 | Ranson et al. | |
| 6,003,107 A | 12/1999 | Ranson et al. | |
| 6,009,539 A | 12/1999 | Ranson | |
| 6,377,912 B1 | 4/2002 | Sample et al. | |
| 6,389,558 B1 | 5/2002 | Herrmann et al. | |
| 6,397,354 B1 | 5/2002 | Ertekin | |
| 6,643,725 B1* | 11/2003 | Kozakai et al. ............. 710/300 |
| 6,732,311 B1 | 5/2004 | Fischer et al. | |
| 6,754,852 B2 | 6/2004 | Swoboda | |
| 6,769,049 B1* | 7/2004 | Bernard et al. ............. 711/154 |
| 6,944,731 B2* | 9/2005 | Bouchard et al. ........... 711/161 |
| 2003/0126508 A1 | 7/2003 | Litt | |
| 2004/0124903 A1 | 7/2004 | Chaudhari | |
| 2004/0193962 A1 | 9/2004 | Johnson et al. | |
| 2004/0193976 A1 | 9/2004 | Slaight et al. | |
| 2005/0166006 A1* | 7/2005 | Talbot et al. ................ 711/105 |

OTHER PUBLICATIONS

Agilent Technologies, "Triggering a Logic Analyzer on Complex Computer Buses", The International Engineering Consortium, (date unknown), pp. 1-17, http://www.iec.org.

* cited by examiner

Primary Examiner—Christine T. Tu

(57) ABSTRACT

One disclosed embodiment may comprise a system that includes a data capture system that stores a set of data from an associated data source in response to a store signal while enabled based on a control signal. A control system provides the control signal based on a number of store cycles relative to an event to define the set of data, the number of store cycles varying based on the store signal.

37 Claims, 8 Drawing Sheets

SYSTEM AND METHOD TO CONTROL DATA CAPTURE

CROSS REFERENCE TO RELATED APPLICATIONS

This application is related to the following commonly assigned co-pending patent applications entitled: "SYSTEM AND METHOD FOR DATA ANALYSIS" Ser. No. 11/032743; "SYSTEM AND METHOD TO QUALIFY DATA CAPTURE" Ser. No. 11/033226; "SYSTEM AND METHOD FOR GENERATING A TRIGGER SIGNAL" Ser. No.11/032949, all of which are filed contemporaneously herewith and are incorporated herein by reference.

BACKGROUND

As higher levels of circuit integration are achieved on a single integrated circuit chip or a chipset, there tends to be an increased complexity associated with internal operation of a chip or associated with internal operation of the chipset. Various types of systems, internal and external, have been developed to facilitate monitoring and/or analyzing operation of a chip or a chipset. As an example, a logic analyzer is one device that can assist some aspects of monitoring and analyzing operation.

DETAILED DESCRIPTION

Figure 1:
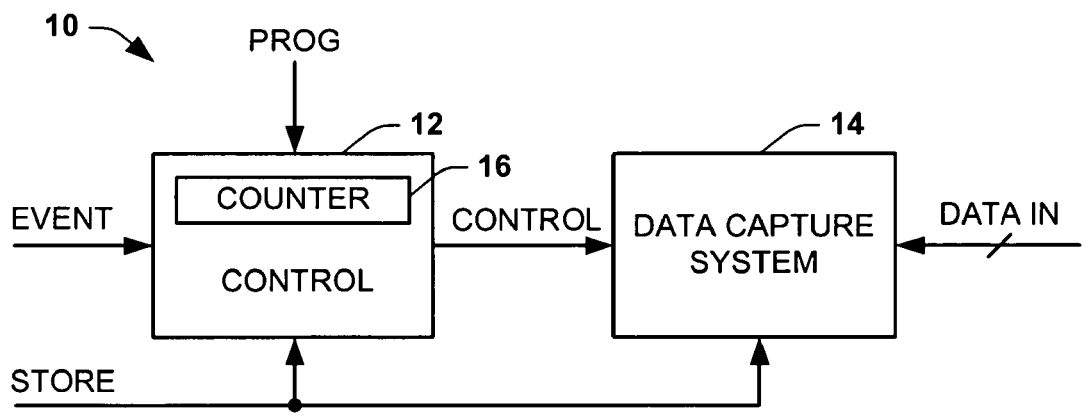
FIG. 1 depicts an embodiment of a system to control data capture.

FIG. 1 depicts an example of a system 10 that can be utilized to control the capture (or storage) of data. The system 10 includes a control block 12 that is operative to define a set of data that is to be stored by an associated data capture system 14. The control block 12 provides a corresponding CONTROL signal to the data capture system 14 based on which the set of data can be captured. For instance, the CONTROL signal can enable or disable the data capture system 14. The data capture system 14 is operative to cause data to be stored in response to a store (STORE) signal during an associated capture session. The STORE signal, for example, can correspond to an instruction to store data, represented as DATA IN, from an associated data source for a given data cycle, such as for a corresponding clock cycle or for multiple clock cycles. The DATA IN can correspond to data from one or more sources, such as a bus, register, interface or any structure capable of propagating or containing data that can be captured by the data capture system 14.

The STORE signal can be provided by an associated component or circuit that is operative to determine whether the DATA IN should be stored. The determination can be made based upon a condition of the DATA IN that is to be stored by the data capture system 14 or based upon an external condition separate from the DATA IN or a combination of circumstances related to DATA IN and not related to DATA IN. The control block 12 provides the CONTROL signal to the data capture system 14 based on the STORE signal so as to define a set of data for storage relative to an event. The event can be indicated by an EVENT signal that is provided to the control block 12. The type of information encoded by the EVENT signal and the number of bits generally will depend upon the context in which the system 10 is implemented. As one example, the EVENT signal can correspond to a trigger signal generated by a trigger state machine of a logic analyzer after one or more conditions of data have been met. As an alternative example, the EVENT signal can correspond to an operating condition or a series of different states or operating conditions associated with operation of hardware, software or a combination of hardware and software. As yet another alternative, the control block 12 can be configured to determine the occurrence of the event, which can be internal or external to the system 10.

By way of further example, the control block 12 can include a counter 16 having a value that varies as a function of the STORE signal. The control block 12 thus can provide the CONTROL signal to the data capture system 14 based on the counter value and the EVENT signal. For instance, the counter 16 can be configured to increment or decrement the counter value (e.g., by a count of one or by another count value) in response to each assertion of the STORE signal after the EVENT signal has indicated the occurrence a corresponding event. The control block 12 can compare the counter value relative to a predetermined value, which can be programmed by a program (PROG) signal, and in turn provide the CONTROL signal based on the comparison of the predetermined value and the counter value. In this way, the control block 12 can define a set of data to be captured according to a count of the number of data store cycles relative to the occurrence of an event (as indicated by the EVENT signal), so that a corresponding set of data can be captured and stored by the data capture system 14. Those skilled in the art will understand and appreciate other ways that the control block 12 can track store cycles for controlling the capture system 14 to store a data set relative to an event.

Figure 2:
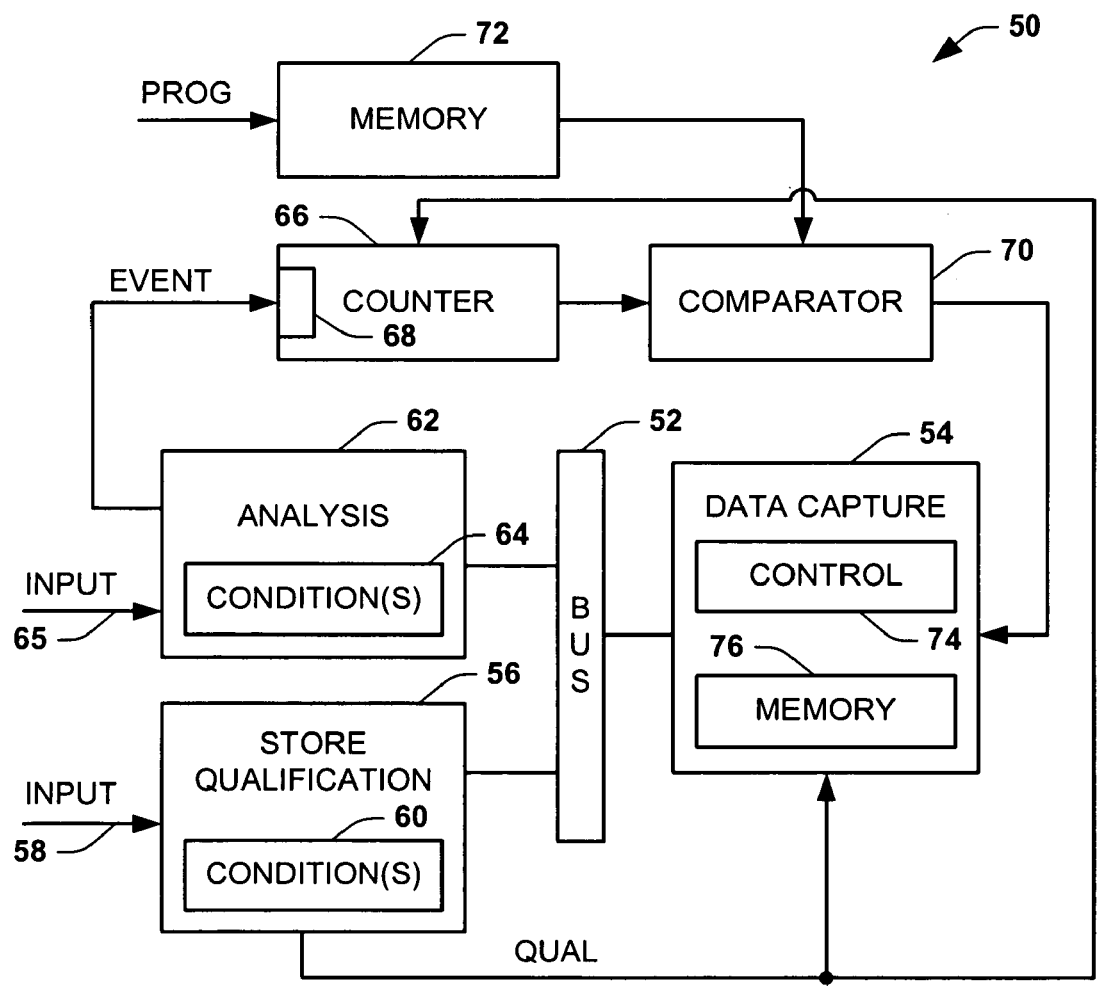
FIG. 2 depicts an embodiment of another system to control data capture.

FIG. 2 depicts an example of a system 50 that can be utilized to control storing data from a data source, depicted as bus 52. The bus 52, for example, receives data from one or more sources in an integrated circuit chip implementing the system 50 or from anywhere in an associated device (e.g., a computer system) in which the system 50 is implemented. The bus 52, for example, can operate as a synchronous (or asynchronous) bus structure configured to propagate multi-bit data from one or more predetermined locations in an integrated circuit in which the system 50 is implemented. Additionally or alternatively, the data bus 52 can receive data from other integrated circuits that may be communicatively coupled with the bus 52, such as within a chipset, as well as from a combination of locations within the same integrated circuit or from any other circuitry communicatively coupled with the bus.

Those skilled in the art will understand and appreciate various approaches and feed structures that can be utilized to drive the bus 52 with data. Examples of feed structures (e.g., interfaces) that can be employed to provide data to the bus 52 include bus interface modules. These and other feed structures can obtain data from within a computer system, such as from other bus structures (e.g., processor bus, PCI bus, etc.) or memory, and provide the data to the bus 52. In a multi-processor, multi-cell computer system, for example, the bus 52 can also include data from other circuit boards, such as provided through a crossbar structure. In such larger systems, a plurality of the systems 50 can be implemented through the computer system, including one or more of such systems on a single integrated circuit. Therefore, the bus 52 may be referred to herein as an observability bus or a debug bus, depending on the context of the system 52.

A data capture system 54 is communicatively coupled to the bus 52 for storing data in response to a qualification (QUAL) signal. A store qualification system 56 provides the QUAL signal to instruct the data capture system 54 to store data from the bus 52. Each clock cycle that the store qualification system asserts the QUAL signal may correspond to a store cycle. The store qualification system 56 can determine that data is qualified for storage based upon the data on the bus 52, based upon one or more input signals 58 or based upon a combination of one or more input signals and the data on the bus. For example, the store qualification system 56 includes one or more conditions 60 that can be applied relative to at least a portion of the data on the bus 52 and provide the QUAL signal based upon whether the one or more conditions are met. Alternatively or additionally, the store qualification system 56 can apply the one or more conditions 60 relative to one or more input signals 58 and in turn provide the QUAL signal if the conditions of the one or more input signals are met. The input signals 58 can be provided based on the data on the bus 52 or the input signals can be independent of the data on the bus. The conditions 60 implemented by the store qualification system 56 can include arithmetic functions, logical functions, matching (e.g., bit wise matching) functions, or a combination thereof.

The system 50 also includes an event analysis system 62 that is operative to determine the occurrence of a predefined event. The event analysis system 62 can determine the occurrence of the event based on one or more conditions 64 that can be predefined. The one or more condition 64 can correspond to a condition or a series of conditions or states that can be applied relative to data that propagates on the bus 52 such as over one or more clock cycles. Additionally or alternatively, the one or more conditions 64 can determine the occurrence of the event based upon one or more input signals 65. The input signal 65 can vary as a function of the data on the bus 52 or can be independent of the data on the bus. The one or more conditions 64 can include a combination of one or more of arithmetic functions, logic functions, matching functions, which functions can further vary as a function of a state of the event analysis system 62, such as corresponding to a state machine. When one or more conditions or a series of conditions have been met, corresponding to the occurrence of the predefined event, the event analysis system 60 provides an EVENT signal.

A counter 66 is operative to track data store cycles based on the QUAL signal. For example, the counter 66 can increment or decrement a counter value for each assertion of the QUAL signal provided by the store qualification system 56 so long as the counter has been enabled. The counter 66 can be enabled in response to the EVENT signal from the event analysis system 62. For example, the counter 66 includes an enable register 68 that is set in response to assertion of the EVENT signal, corresponding to the occurrence of the predefined event. The register 68 thus operates to enable the counter 66 to track qualified store cycles relative to the occurrence of a predefined event as indicated by the EVENT signal.

A comparator 70 is operative to compare the counter value provided by the counter 66 relative to a predetermined value, which can be stored in associated memory 72 (e.g., system addressable memory, such as a control and status register (CSR)). The predetermined value can be programmed by a program (PROG) signal. The value stored in memory 72 controls how the data capture system 54 stores a set of data relative to the occurrence of the predefined event. The memory 72 can be programmed by various means, which can include but are not limited to configuration utilities (e.g., via a serial or JTAG interface communicatively coupled to the memory) or by other configuration tools or by scan-on-the-fly.

The data capture system 54 is responsive to the output signal from the comparator 70 for storing a corresponding set of data. The corresponding set of data can correspond to a time slice of data that as it is stored relative to the occurrence of a trigger event. The relative timing of the time slice of data can be set to vary depending on the size of the counter 66 relative to the data storage capacity of the data capture system 54. For instance, the memory 72 can be programmed with a value that controls the data capture system 54 to store a time slice of data prior to the occurrence of a trigger event, after a trigger event or a set of data (e.g., in a capture one or more windows) that includes a time slice of data that overlaps with the trigger event. More than one time slice can be captured during a capture session. The comparator 70 thus can provide a control signal that is operative to control (e.g., disable) the data capture system 54 when the counter value equals the predetermined value stored in the memory 72. Alternatively, the counter 66 can be preset to a value and be decremented in response to the QUAL signal. After the counter reaches zero or another predefined value, the signal can be provided to control the data capture system 54 for defining the data set relative to the occurrence of a trigger event.

The data capture system 54 includes control logic 74 that is operative to control storage of data from the bus 52 in response to the QUAL signal, which indicates qualified store cycles. The data can be stored in memory 76 based upon control information provided by the control block 74. While the memory 76 is depicted as being within the data capture system 54, it will be understood and appreciated that the memory could be external, internal or both internal and external. For example, the memory 76 can include an arrangement of one or more buffers, registers, RAM or other storage devices capable of data being written from the bus 52 to such device.

By way of a first example scenario, the data capture system 54 may store a set of data in a capture buffer prior to a trigger event for a minimum predetermined value stored in the memory 72 (e.g., PROG=0). In such a scenario, control logic 74 would turn off and stop storing data from the bus in response to EVENT signal indicating the occurrence of a trigger event. Thus, the data stored by the capture system prior to the EVENT signal would correspond to the set of data. As an alternative scenario, the PROG signal can set the predetermined value in the memory 72 to cause the data capture system 54 to store a set of data after the occurrence of a trigger event based on a maximum predetermined value corresponding to the size of the capture buffer. In this latter scenario, the control logic 74 would fill memory 76 (e.g., an arrangement of one or more buffers) with data beginning at some number of one or more store cycles after a trigger event. Thus, the memory 72 can also be programmed to control the data capture system 54 to store future data, such as by reading data from the data capture system and storing such data in other associated memory over a plurality of store cycles after the trigger event.

Figure 3:
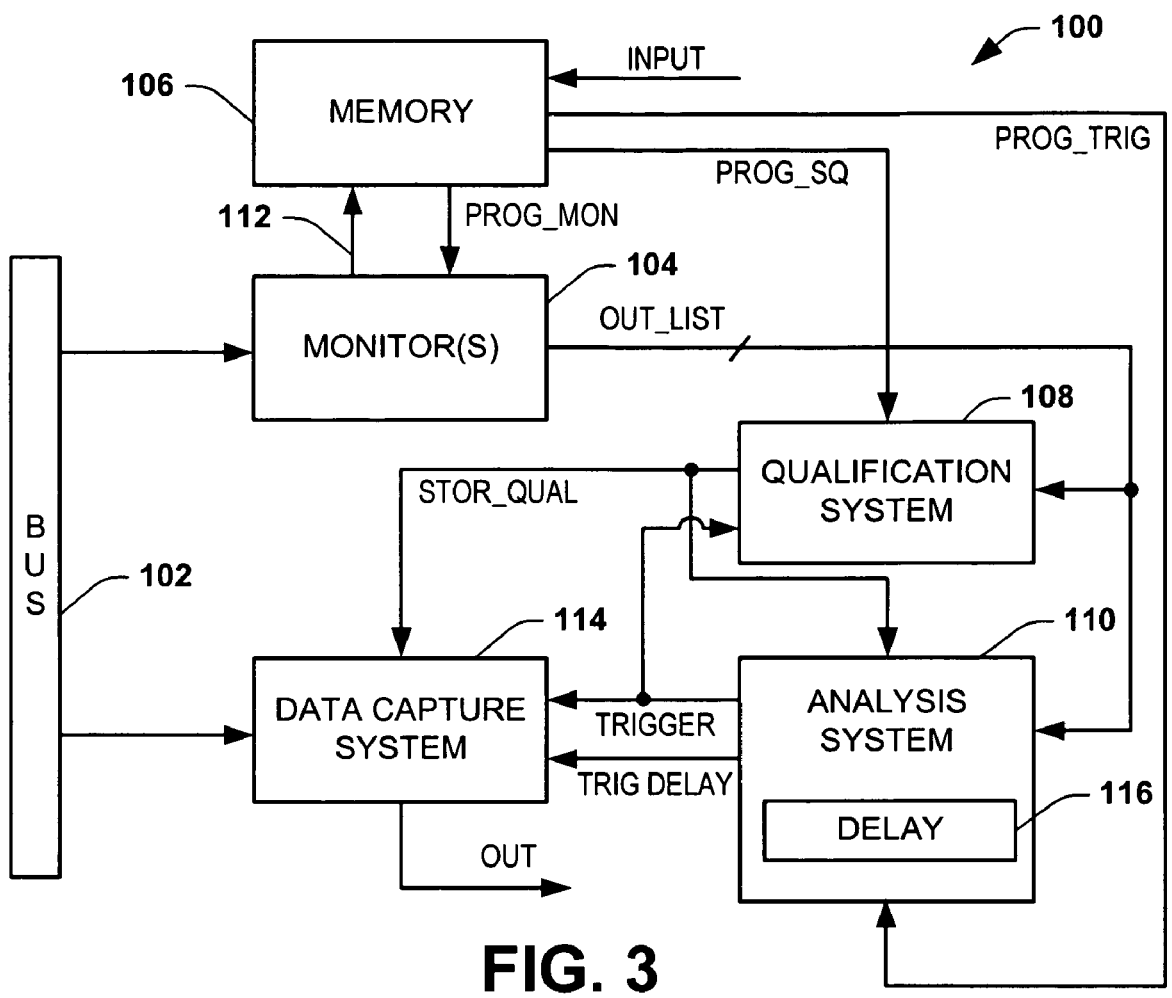
FIG. 3 depicts an embodiment of an integrated logic analysis system.

FIG. 3 depicts an example of a logic analysis system 100. The system 100 is utilized to acquire data from a data bus 102. The data bus 102, for example, can receive data from one or more sources in an integrated circuit chip or from anywhere in an associated device in which the system 100 is implemented. Those skilled in the art will understand and appreciate various approaches and feed structures that can be utilized to drive the bus 102 with data. The data bus 102, for example, can operate as a synchronous bus structure configured to propagate multi-bit data from one or more predetermined locations in an integrated circuit in which the system 100 is implemented. In a multi-processor, multi-cell computer system, for example, the bus 102 can also receive data from other circuit boards, such as provided through a crossbar structure.

A monitoring system 104 receives and monitors data provided on the bus 102. The monitoring system 104 can include a plurality of performance monitors/counters programmed and/or configured to determine whether certain performance conditions have been met based on the data propagated on the bus 102. For instance, the monitoring system 104 can be configured to implement arithmetic operations, logic operations, and matching operations, as well as combinations thereof relative to a subset of the data on the bus 102. The monitoring system 104 can provide a corresponding multi-bit output (OUT_LIST) that indicates the results of each performance condition being monitored. The monitoring system 104, for example, can assert a corresponding output bit in the TRIG_OUT_LIST signal for each clock cycle that a given condition for a predetermined subset of some or all of the data bus 102 is met.

The performance conditions can be programmable and defined by writing to an associated memory 106. The associated memory 106 can be one or more system addressable memory blocks within the computer system (e.g., an array of control and status registers) that is programmable by one or more program (INPUT) signals. The INPUT signals can be employed to set desired logic, matching and/or arithmetic operations that are to be performed by the monitoring system 104 relative to the data on the bus 102. The memory 106 can provide (or the monitoring system 104 can read) PROG_MON signals to program the performance conditions for each performance condition monitored by the monitoring system 104. There can a separate block of the memory 106 associated with programming each performance condition that the monitoring system 104 is to evaluate. For example, corresponding blocks in the memory 106 may be programmed by an internal processor (e.g., via system addressable memory) or from an external device or system utility by writing to predetermined address locations in the memory 106 that are assigned to respective performance monitoring circuits of the monitoring system 104.

The monitoring system 104 provides the TRIG_OUT_LIST signals to a qualification system 108 and to an analysis system 110. The TRIG_OUT_LIST signals can be provided as data over a multi-bit bus that includes a respective output for each performance condition that is monitored by the monitoring system 104. For example, when a particular condition being implemented by the monitoring system 104 is met, a corresponding bit (or bits) in the TRIG_OUT_LIST signals can be asserted by the system 104 for a clock cycle. The assertion of the corresponding bit (or bits) in the TRIG_OUT_LIST signals can correspond to incrementing a corresponding counter or other tracking circuitry in a respective performance monitoring circuit of the monitoring system 104. Thus, the multi-bit output TRIG_OUT_LIST thus provides an indication as to whether certain conditions have been met in the data provided on the bus 102, and another signal 112 can provide a value associated with such performance over time. Those skilled in the art will understand and appreciate that the monitoring system 104 can be programmed and configured to monitor any number of one or more conditions associated with the data on the bus 102.

The qualification system 108 performs matching and qualification functions relative to the TRIG_OUT_LIST data provided by the monitoring system 104. The qualification system 108 provides a STOR_QUAL signal to an associated data capture system 114 to identify whether data should be captured from the data bus 102. The qualification system 108, for example, can be programmed via a PROG_SQ signal, such as to perform qualification logic or matching functions on a selected group or subgroups of the TRIG_OUT_LIST data relative to programmed data. The matching function, for example, can implement a matchable masking function that determines whether data should be captured from the data bus each clock cycle based on the results of the variables represented by the TRIG_OUT_LIST signals. The matching function can thus provide the STOR_QUAL signal to identify one or more patterns associated with the results of the performance conditions being monitored by the monitoring system 104.

The analysis system 110 is configured to perform internal logic analysis relative to the TRIG_OUT_LIST data from the monitoring system 104. The analysis system provides a TRIGGER signal and a trigger delay (TRIG_DELAY) signal to control a capture session for acquiring a set of data from the bus 102. For example, the analysis system 110 can be implemented as a state machine structure (e.g., Mealy or Moore) that transitions between states based on the performance conditions implemented by the monitoring system 104. As described herein, when the performance conditions are met, respective data in the TRIG_OUT_LIST can be asserted for a clock cycle to enable logic analysis to be performed by the analysis system 110. The analysis system 110 can provide the TRI_DELAY signal to the data capture system 114 based on the TRIG_OUT_LIST signals and the STOR_QUAL signal. The TRIGGER signal can also be provided to the qualification logic block 108, as mentioned above.

The analysis system 110 can be configured (e.g., programmed via system addressable memory) with a vector (PROG_TRIG) that defines a set of conditions to be applied by associated circuitry for analyzing the TRIG_OUT_LIST and possible state transitions that can occur based on the conditions implemented. The analysis system 110 can also employ conditional branching that provides for additional state transitions that can vary for the condition associated with each branch based on the TRIG_OUT_LIST data as well as based on the current state of the state machine. Trigger events or conditions can occur when the analysis system 110 transitions into one or more of the programmable states of the analysis system, which state(s) is designed to cause the TRIGGER signal to assert. For example, the state machine can include a FINAL STATE that causes the analysis system 110 to assert the TRIGGER signal. Additionally, a predetermined number of one or more occurrences of a condition can be required before transitioning to a next state. For instance, a value can be programmed (e.g., via the PROG_TRIG signal) to set a number of occurrences for a given condition associated with a least a portion (e.g., one or more) of the TRIG_OUT_LIST data that must be met to enable a transition to a next state for the given condition. Programmable means can also exist to force the analysis system 110 to assert the TRIGGER signal.

The analysis system 110 also includes a delay system that can provide the TRIG_DELAY signal to define a set of data relative to the occurrence of a predetermined event. In the example logic analysis system 100, the predetermined event corresponds to the TRIGGER signal being asserted, which can occur as the state machine transitions to a given one of its plurality of states. The delay system 116 is programmed to count or track a number of qualified store cycles based on the STOR_QUAL signal relative to (e.g., before, after or overlapping with) the TRIGGER signal. The delay system 116 provides the TRIG_DELAY signal in response to counting or tracking the predetermined number of store cycles while enabled in response to the TRIGGER signal being asserted.

In a further example, the delay system 116 can be programmed (e.g., via the PROG_TRIG signal) to adjust the timing of data capture relative to a trigger point, such as when the TRIGGER signal is asserted. For example, the PROG_TRIG signal can set one or more entries in system addressable memory (e.g., a register array or other memory) to set a trigger delay value that is utilized to define whether the capture buffer is to store data before the occurrence of a trigger event, after the occurrence of a trigger event or within some window that includes a trigger event. The window, for example, can vary based on the size of the one or more buffer employed by the data capture system 114 or other memory utilized in conjunction with the one or more buffers used to store the data from the bus 102.

The data capture system 114 is operative to store data from the bus 102 based at least in part on the STOR_QUAL signal from the qualification logic and based on the TRIGGER and TRIG_DELAY signal(s) provided by the analysis system 110. The data capture system 114 includes capture buffer control logic that can be set to define a quantity of data that is to be stored, a type of data that is to be stored and how data will be stored. For example, the control logic of the data capture system 114 can include an arrangement of hardware arranged to activate the data capture system 114 for reading and storing data from the bus 102 in response to the STOR_QUAL and TRIG_DELAY signals. The data capture system 114 can provide its corresponding output signal (OUT) to associated memory, such as system addressable memory, which can be read by a system processor.

Those skilled in the art will appreciate various types of memory structures (e.g., register arrays, buffers, RAM, cache and the like) that can be utilized for inputting program data to various parts of the system 100 and for storing output OUT data from the system 100. Additionally, the system 100, including the monitoring system 104, the qualification system 108, the analysis system 110 and the data capture system 114 (or at least portions thereof) can be implemented as part of an application specific integrated circuit (ASIC). The ASIC can be implemented as an integrated logic analyzer internal to a chipset, such as part of a computer system, a router, or other complex circuitry.

Figure 4:
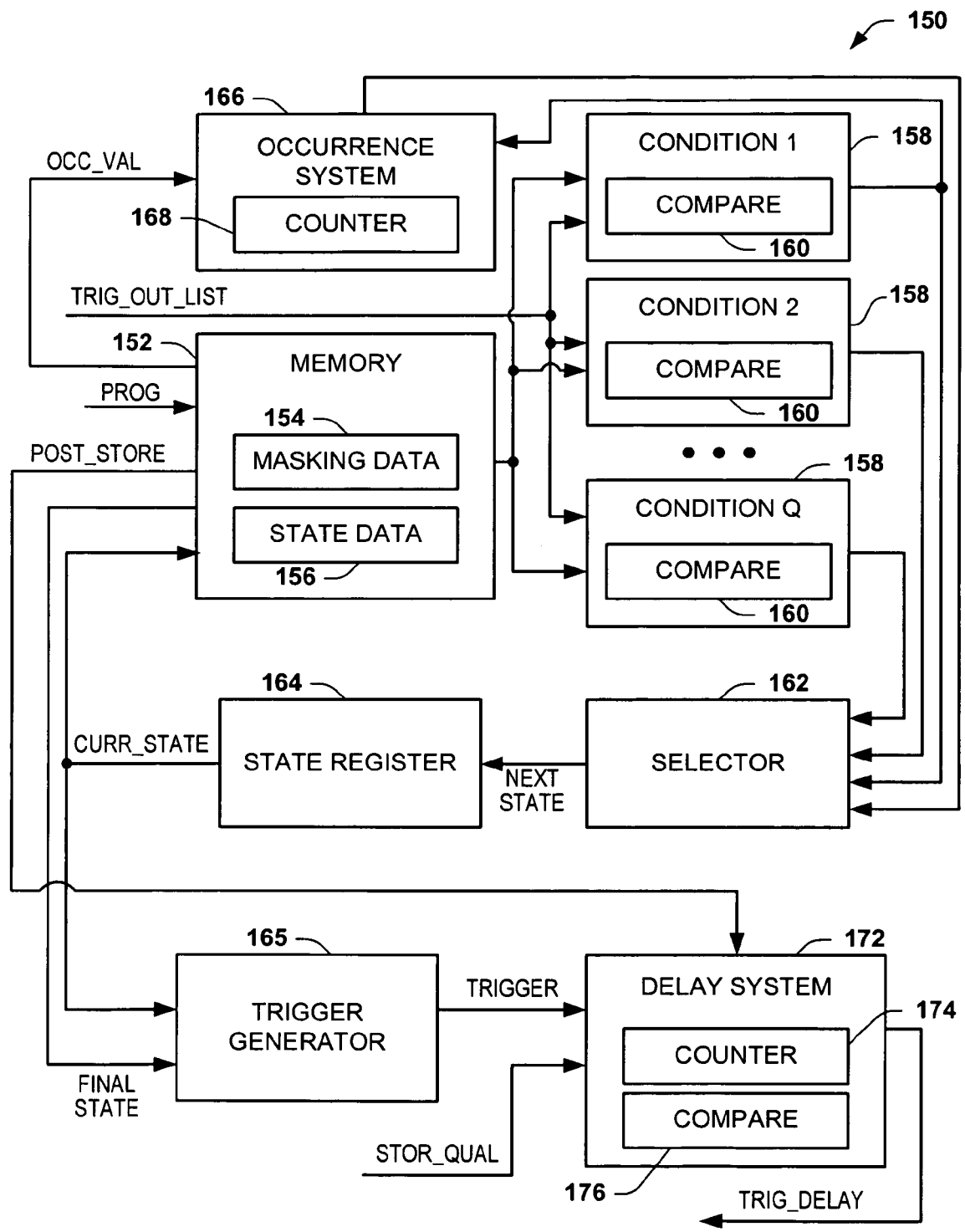
FIG. 4 depicts an embodiment of an analysis system.

FIG. 4 depicts an example of an analysis system 150 that can be utilized for logically analyzing data provided on a bus, such as a multi-bit synchronous observability or debug bus. The analysis system 150 employs a memory 152 that stores a vector, which can include masking data 154 that defines one or more conditions for implementing a state machine. The memory 152 can also include state data 156 that defines states and transitions among the available states. For example, the memory 152 can be any type of system addressable memory (e.g., a register array, such as a CSR) that can be written to, such as from a system processor of a computer system in which the analysis system 150 is implemented. The memory 152 can also be read from to drive state transitions based on the TRIG_OUT_LIST.

The analysis systems 150 implements a state machine that transitions among a plurality of available states based on the TRIG_OUT_LIST, which describes performance characteristics of the data on the bus. Those skilled in the art will understand and appreciate various ways in which the analysis system 150 can be implemented to analyze the performance information provided in the TRIG_OUT_LIST signals. The analysis system 150 can include one or more condition components 158 that control state transitions for the state machine from a current state (CURR STATE) to a NEXT STATE. The CURR_STATE can include one or more bits (e.g., a three bit value) that determine how data propagated on the bus (e.g., the debug bus) will be analyzed and captured. The sequence of possible states, transitions between states, and functions perform by each condition component 158 can be programmed as a state transition vector in the memory 152 defined by the masking data 154 and the state data 156.

In the example of FIG. 4, the condition components are represented as CONDITION 1, CONDITION 2 and CONDITION Q, where Q is a positive integer (Q≧1) denoting a number of conditional branches and functions that can be implemented for each state. Those skilled in the art will understand and appreciate various types of conditions and other numbers of condition components 158 can be utilized in the analysis system 150. The condition components 158, for example, correspond to conditional logic and conditional branches performed on the TRIG_OUT_LIST to control state transitions for the state machine. The condition components 158 employ compare blocks (e.g., comparator circuitry) 160 to implement their respective functions on the TRIG_OUT_LIST according to masking data 154 read from the memory 152.

As an example, the compare block 160 for each condition component 158 can implement bit-wise masking (or matching) relative to the performance condition data represented by the TRIG_OUT_LIST. The compare blocks 160 thus can implement matching each cycle based on a masking vector stored as the masking data 154. The vector in the masking data 154 can be different for each compare block 160. The masking data 154 further can be fixed for a given capture session or the masking data can vary over a capture session, such as by employing different masking vectors for some or all of the available states. When a masking vector for a given condition component 158 matches the TRIG_OUT_LIST, the condition component provides a corresponding output to a selector 162 indicating that the condition has been met (e.g., the vector is enabled).

The selector 162 is operative to identify the NEXT STATE for the state machine based on the outputs from the conditions components 158. The condition components 158 can be employed as hierarchical arrangement of elements that control state transitions. For example, the condition components 158 can function as a priority encoder that implements state transitions based on the CURR STATE and based on the TRIG_OUT_LIST. As a priority encoder, the selector 162 can set the NEXT STATE based on which of the condition components is enabled according to the priority assigned to the respective condition components 158.

Accordingly, the condition components 158 may operate as separate conditional branches that can be employed to implement predefined state transitions (e.g., preprogrammed as the state data 156) for the state machine based on comparing the TRIG_OUT_LIST relative to the corresponding masking data 154 associated with each condition branch.

By way of further example, the following TABLE I provides a truth table representation of possible state transitions that can be implemented by the condition components 158 according to the results of the comparisons performed by the respective compare blocks 160. The entries in TABLE I, for example, correspond to the outputs of the three condition components 158 shown in FIG. 4. For instance, CONDITION 1 corresponds to a first or highest priority condition (e.g., an "if" condition), CONDITION 2 corresponds to a next highest priority condition (e.g., an "else if" condition) and CONDITION Q corresponds to a lowest priority condition (e.g., another "else if" condition). The values of the outputs for each of the respective condition components 158 thus indicates whether the respective vectors (stored in the masking data 154) are enabled (denoted by a logic "1") or are disabled (denoted by a logic "0"), such as by the compare blocks 160 comparing the TRIG_OUT_LIST with corresponding masking data 154. In TABLE I, the letter "X" denotes a "don't care" state associated with the respective outputs of condition components 158. When none of the conditions are met (e.g., all conditions equal 0), the selector 162 maintains its current state. Those skilled in the art will understand and appreciate various ways in which the functionality similar to that demonstrated in TABLE I can be realized to implement a state machine within a computer system, including hardware and/or software, based on the teachings contained herein.

TABLE I

| COND 1 | COND 2 | COND Q | RESULT |
|---|---|---|---|
| 0 | 0 | 0 | Load CURR_STATE |
| 0 | 0 | 1 | Load CONDITION Q NEXT STATE |
| 0 | 1 | X | Load CONDITION 2 NEXT STATE |
| 1 | X | X | Load CONDITION 1 NEXT STATE |

The selector 162 provides the next state information to a state register 164. The state register 164 thus provides an indication of the current state as the CURR STATE signal. As mentioned above, the CURR STATE can be employed to select a next available state from the state data 156 as well as (optionally) redefine the masking vector to be applied be each of the condition components 158 for the current state.

The system 150 can also include an occurrence system 166 that is operative to require multiple hits or occurrences by one or more given condition components 158 before enabling the selector 162 to transition to a next state for the given condition component. For purposes of explanation, the example of FIG. 4 assumes that the occurrence system 166 applies only to the CONDITION 1, although other occurrence requirements can also be utilized in conjunction with other conditional branches of the analysis system 150. The occurrence system 166 thus provides an occurrence enable signal to the selector 162 indicating whether the predefined number of occurrences has been met for the given condition component (e.g., CONDITION 1) 158. The selector 162 thus can select the next state assigned to CONDITION 1 only if, for example, the occurrence enable signal indicates the number of occurrences has been met.

As an example, the occurrence system 166 includes a counter 168 that is operative to count occurrences when the compare block 160 for CONDITION 1 indicates that the corresponding masking vector is met for the CURR STATE. The memory 152 can provide an occurrence value (OCC_VAL) to the occurrence system 166. The value of OCC_VAL defines a number of one or more occurrences that are required before the masking data vector associated with CONDITION 1 can enable the selector 162 to load the next state vector associated with CONDITION 1. The same or different occurrence values can be programmed for different states of the state machine. The occurrence system 166 compares OCC_VAL relative to the value provided by the counter 168 and provides the occurrence enable signal to the selector 162 based on the comparison. The occurrence enable signal masks off the next state vector associated with CONDITION 1 until the OCC_VAL is met by the output of the counter 168. Accordingly, until the occurrence requirements associated with the CONDITION 1 have been met, the next state of the state machine will correspond to one of the next state vectors associated with one of the other condition components 158.

The analysis system 150 also includes a trigger generator 170. The trigger generator 170 is operative to generate the TRIGGER signal based on the CURR STATE relative to a predefined FINAL STATE, which can be stored in the memory 152. The trigger generator 170 can also include additional logic to force the trigger generator to provide the TRIGGER signal. Those skilled in the art will understand and appreciate various ways in which a TRIGGER signal can be generated, such as based on desired performance characteristics and design requirements.

The system 150 also includes a delay system 172 that is operative to generate the TRIG_DELAY signal based on the TRIGGER signal and the STOR_QUAL signal. A counter 174 is enabled based on the increment its value provided that the TRIG_DELAY signal is not asserted and both the STOR_QUAL and TRIGGER signals are asserted (e.g., corresponding to qualified trigger events). As an example, the delay system includes logic that ANDs the TRIGGER signal with an inverted version of the TRIG_DELAY signal and the STOR_QUAL signal for determining the occurrence of a trigger event at a qualified store cycle. The counter 174 can increment its value for each qualified store cycle after the trigger generator has asserted the TRIGGER signal.

The delay system 172 includes a comparator 176 that compares the output of the counter 174 relative to a predefined counter value, indicated at POST_STORE. The POST_STORE value can be a predefined value that is read from corresponding system addressable memory 152 for implementing a desired trigger delay. The POST_STORE value can be programmed, such as for a given capture session, to define a trigger delay value that sets a data capture point relative to a corresponding trigger event (e.g., when the TRIGGER signal is asserted).

For example, a corresponding data capture system can capture a set of data in a capture buffer prior to a trigger event based on a minimum POST_STORE value (e.g., POST_STORE=0). In such a scenario, the data capture system would turn off and stop storing data from the bus at a trigger event when the counter equals zero. Alternatively, the POST_STORE value can set the trigger delay to cause the data capture system to store all data after a trigger event based on a maximum POST_STORE value corresponding to the size of the capture buffer. In this latter scenario, the capture buffer would fill the capture buffer with data from the bus for each qualified store cycle beginning after a trigger event. Depending on the size of the counter 174, a POST_STORE value may also be set to store future data, such as by reading data from the data capture system and storing the data in memory over a plurality of cycles after the trigger event. Another alternative is to store a set of data based on the POST_STORE value in a capture window (or windows) that resides within any one or more of the preceding data capture scenarios. The TRIG_DELAY signal thus can be provided to the data capture system along with the STOR_QUAL signal for controlling operation of the data capture system, such as described herein.

Figure 5:
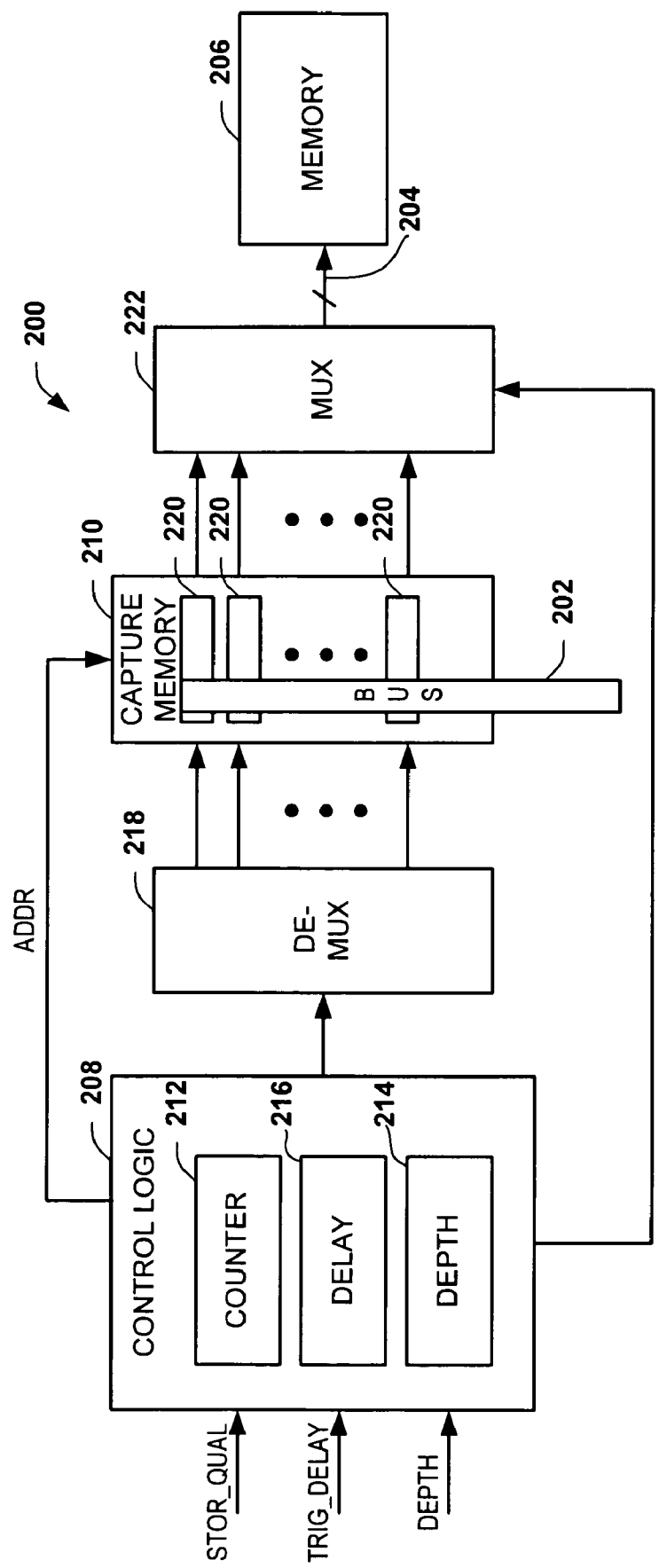
FIG. 5 depicts an embodiment of a data capture system.

FIG. 5 depicts an example of a data capture system 200 that can be utilized for storing data from a data bus (e.g., an observability or debug bus) 202. The data on the bus 202 may be logically partitioned to facilitate storing different parts of the data. For the example of an 80-bit debug bus 202, one portion of bus can include bits [39:0] and another portion of the bus can include bits [79:40]. Each of the bus portions can include any number of bits and that the bus can be separated into any component parts which can contain the same or different numbers of bits.

The data capture system 200 provides corresponding output data (e.g., a single or multi-bit data stream) 204 from the bus 202, which can be provided to an addressable memory field of associated memory 206. The memory 206 can be implemented as system addressable memory, such as a register array, or some other type of system memory in a computer system in which the data capture system 200 is being implemented. The data in the memory 206 can also be read from and stored in a non-volatile storage device (not shown), such as FLASH memory, EEPROM or a hard disk drive to name a few. The data capture system 200 provides the output data 204 based at least in part on a TRIG_DELAY signal (defining how data is captured relative to a trigger event) and a STOR_QUAL signal.

The data capture system 200 includes control logic 208 that is operative to control associated capture memory 210 for capturing or reading data from the bus 202. The control logic 208, for example, can include an arrangement of gates and other circuitry (e.g., a DSP) operative to capture data from the bus 202.

By way of example, the control logic 208 can include a counter 212 operative to control which data is read from the bus 202 and is written to the capture memory 210. The counter 212, for example, can be implemented as a multi-bit address counter (e.g., an 11 bit counter) that maintains a count value that controls what data is to be captured from the data bus 202. Different portions of the multi-bit counter 212 can be employed for controlling different aspects of the system 200. For example, a set of bits (e.g., least significant bits) from the counter 210 can define an address of selected data on the bus 202 that are to be captured by memory modules (e.g., buffers) 220 in the capture memory 210. The control logic 208 thus can provide an address (ADDR) signal to the capture memory 210 that defines a corresponding address for data to be captured from the portion of the bus 202 associated with the memory modules 220.

Another set of bits from the counter 212 can be provided to a de-multiplexer (DE-MUX) 218 that provides a set of output signals based on the set of counter bits from the control logic 208. The de-multiplexer 218 is operative to drive a corresponding portion of the capture memory 210 for storing selected data from the data bus 202 in associated memory modules 220. For instance, the de-multiplexer 218 provides an enable signal to one or more of the memory modules 220 based on the control input from the control logic 208, corresponding to one or more bits (e.g., a portion of the most significant bits) from the counter 212 for selectively enabling the memory modules. As the counter 212 increments, the de-multiplexer 218 will enable each of the memory modules 220 in a corresponding sequence. The enabled memory module 220 is activated to read data from the bus 202 and to store such data in the memory module based on the (ADDR) signal. As mentioned above, the counter 210 can provide the ADDR signal, such as corresponding to a set of least significant bits sufficient to encode the amount of data being propagated over the of the bus 202.

The memory modules 220 provide corresponding multi-bit inputs to output multiplexer (MUX) 222. The multiplexer 222 can also be controlled based on a control signal from the control logic, such as corresponding to some of the counter data corresponding to one or more bits (e.g., a portion of the most significant bits) from the counter 212. The control logic 208 can provide the same or different control signals to multiplexer 222 and the de-multiplexer 218. The multiplexer 222 provides the output data signal 204 according to which of the memory modules 220 is enabled during a given clock cycle. The output data signal 204 thus can be written to system addressable memory 206 and accessed via an associated processor for further analysis or for implementing other functions (e.g., fault control) within the computer system.

A depth control block 214 can be programmed via a DEPTH signal (e.g., stored in associated addressable memory) to control the capture depth. The capture depth, for example, can set from which portion of the bus 210 data is to be stored for each qualified store cycle. For instance, in an 80-bit bus, the capture depth can set how many (and possibly which) of the 80 bits are to be captured for each qualified store cycle. By programming the DEPTH signal to one value, the data capture system 200 can be selectively configured to operate in a first mode that stores less data, but at a deeper level on the bus by capturing data from a larger portion of the bus (e.g., the entire bus) 202. In a second mode, the data capture system 200 can store more samples of data in the memory 206, but for a smaller portion (e.g., one-half) of the bus 202. The amount of data that is stored generally will vary depending on the size of the memory 206 relative to the capture depth. Those skilled in the art will understand and appreciate that other capture depths, any number of which can be implemented by the depth control block 214 based on the DEPTH signal.

The control logic 208 can also include a delay block 216 that controls when data is to be captured based on the TRIG_DELAY signal. For example, the control logic 208 receives the TRIG_DELAY signal from an associated delay system (e.g., the delay system 222 of FIG. 4). The TRIG_DELAY signal can be a single bit value that identifies when a predetermined number of store cycles (e.g., based on the STOR_QUAL signal) have occurred relative to a trigger signal asserting. The TRIG_DELAY signal alternatively could be a multi-bit signal. The associated delay system thus provides the TRIG_DELAY signal to control a window of data that is to be stored relative to a trigger event, such as described above with respect to FIG. 2 or 4. For example, the associated delay system can be programmed to implement a plurality of data stores from the bus 202 before a trigger event, after a trigger event or a window of stores that overlap with a trigger event. As mentioned above, a trigger event can occur in response to a trigger state machine entering a final state, such as in response to data propagated on the bus 202 meeting one or more conditions. Thus, the data capture system 200 is operative to continue capturing and storing data from the data bus 202 in response to the STOR_QUAL signal so long as the TRIG_DELAY signal does not assert. When the TRIG_DELAY signal asserts, for example, the control logic 208 can control the system 200 to turn off and stop storing data from the bus 202, effectively ending a capture session.

Figure 6:
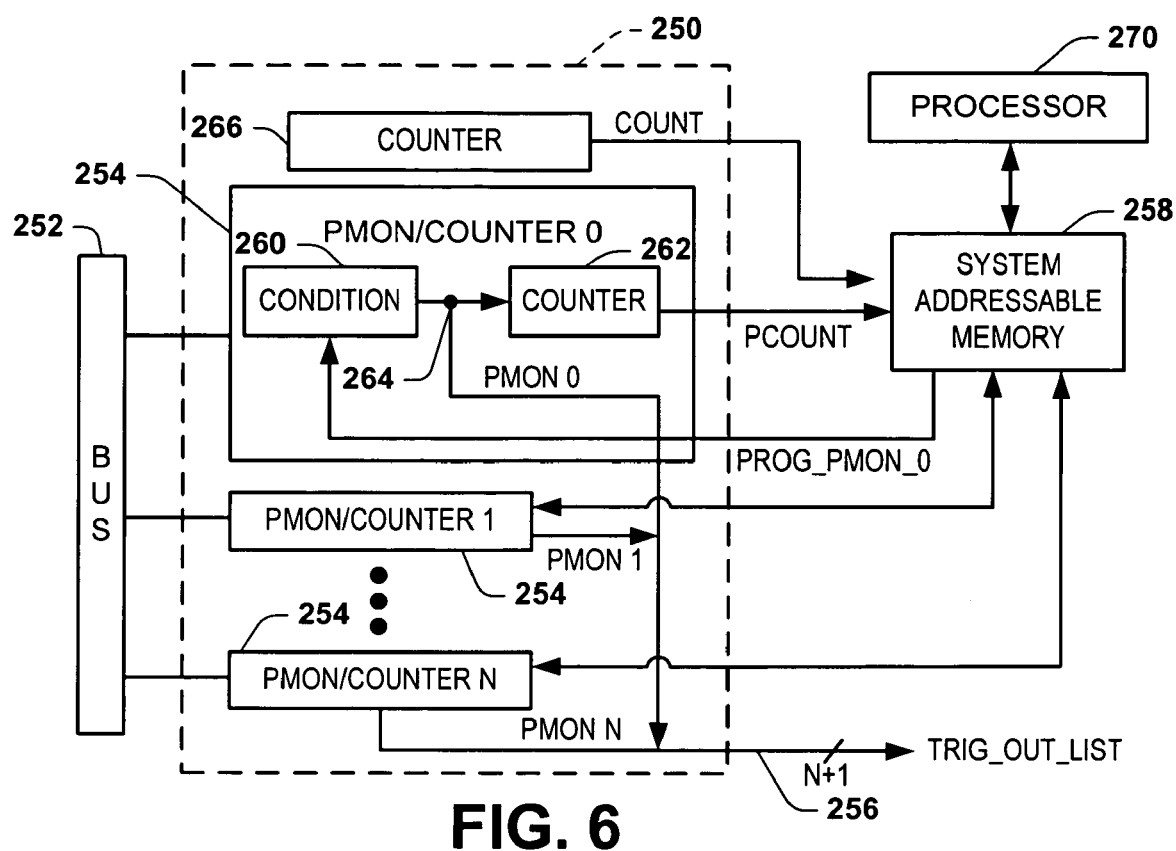
FIG. 6 depicts an embodiment of a monitoring system.

FIG. 6 depicts an example of a performance monitoring system 250 that can be utilized to monitor performance characteristics associated with data on a bus 252, such as an observability bus. The performance monitoring system 250 can be implemented as part of a logic analysis system implemented within an IC, such as forming part of a chip set for a computer system. The performance monitoring system 250 includes a plurality of subsystems represented as performance monitor counters (PMON/COUNTER 0 and PMON/COUNTER 1 through PMON/COUNTER N) 254, where N is a positive integer and N+1 denotes the number of PMON/COUNTERS 254. The PMON/COUNTERS 254 collectively drive an output bus 256 corresponding to a multi-bit output signal indicated at TRIG_OUT_LIST. The output bus 256 thus can include N+1 bits, one bit associated with each of the PMON/COUNTERS 254.

Each of the PMON/COUNTERS 254 can be implemented as an arrangement of programmable logic, such as a programmable logic device (PLD), a field programmable gate array, other hardware, or as a combination of hardware and software. Each PMON/COUNTER 254 can be programmed to implement an operation or function for a selected portion or subrange of the data on the bus 252. For instance, each PMON/COUNTER 254 can implement a matching function relative to one or more selected bits from the bus 252. The PMON/COUNTERS 254 can also implement logic functions (e.g., invert, AND, OR, XOR, NOR, AND, XNOR and other logic functions and combinations of functions), arithmetic functions (e.g., addition, subtraction, multiplication, division, etc.), as well as combinations of logic and arithmetic functions on one or more bits on the bus 252.

System addressable memory 258 is operatively associated with each of the PMON/COUNTERS 254 to program a desired operation or function to be performed relative to data on the bus 252. The system addressable memory 258 can be accessed by a system processor 270 as well as by associated diagnostic utilities (not shown) or other devices that are capable of writing to the system addressable memory 258. The data in the system addressable memory 258 programs a particular operation or function that is performed by each of the respective PMON/COUNTERS 254.

In the example of FIG. 6, PMON/COUNTER 0 is depicted as including a condition block 260 and a counter 262. The condition block 260 implements a performance condition on one or more selected bits of data on the data bus 252, which condition can include performing an operation or function on the data, such as an arithmetic function, a logic function or a combination of logic and arithmetic functions. The particular logic and/or arithmetic function performed by the PMON/COUNTER 0 can be programmed according to a PROG_PMON_0 signal from the system addressable memory 258. The PROG_PMON_0 signal can also establish on which data from the bus 252 the performance condition is to be implemented, such as by identifying respective addresses for such data.

For example, the PROG_PMON_0 signal can include one or more bits that set the performance condition (e.g., logic function and/or arithmetic operation) that is performed on selected data from the bus 252. The condition block 260 provides a condition signal (PMON 0) 264 to the counter 262 based on application of the function or operation on the data. The condition block 260 can perform the performance condition every clock cycle or at other selected time intervals. When the performance condition is met, the condition block 260 asserts its output 264 (e.g., a logic HIGH for a clock cycle) corresponding to PMON 0, such as for one or more clock cycles. As an example, if the performance condition is met over a plurality of clock cycles, the condition block 260 may maintain PMON 0 in the asserted state over the plurality of clock cycles. Alternatively, the condition block 260 can toggle the PMON 0 output signal. The PMON 0 corresponds to part of the output bus 256 that forms the TRIG_OUT_LIST signals.

The output condition signal PMON 0 can also adjust a measure of performance associated with the data being monitored by the condition block. In the example of FIG. 6, PMON 0 monitored increments (or decrements) the counter 262 according to whether the performance condition implemented by the condition block 260 is met in a given clock cycle. The counter 262 provides a PCOUNT signal having a value indicative of the measure of performance monitored by the respective performance monitoring subsystem. For example, the PCOUNT signal can have a value indicative of the number of times the performance condition implemented by the condition block 260 is met, such as during a given capture session or over a plurality of sessions. The counter 262 can be reset, if needed.

For purposes of simplicity of explanation, the internal contents of the other PMON/COUNTER 1 through PMON/COUNTER N have been omitted from FIG. 6, although it will be understood that each can be similarly configured as shown and described with respect to PMON/COUNTER 0. That is, each PMON/COUNTER 254 can be programmed and/or configured to perform respective performance conditions that drive associated counters based on whether the conditions are met. Each time a counter is incremented (or decremented) based on a performance condition, a corresponding PMON output from the respective PMON/COUNTER 254 is also asserted in the TRIG_OUT_LIST signals on the bus 256 (e.g., for a clock cycle). Each of the N bits on the bus 256 associated with the TRIG_OUT_LIST signals thus provides an indication of performance associated with a selected part of the data on the bus 252 according to the performance conditions implemented by condition blocks in each of the PMON/COUNTERS 254. While the PMON/COUNTERS 254 have been described as being programmable, it is also contemplated that one or more of the PMON/COUNTERS 254 can be hardwired to implement fixed performance monitoring conditions.

The system 250 can also include another general counter 266 that increments a counter value to provide a reference COUNT signal with each clock cycle (or on some other periodic interval). The value of the counter 266 thus can be compared or evaluated relative to the PCOUNT signal from the counter 262 (as well as to counters of the other PMON/COUNTERS 254) to ascertain an indication of the frequency that the respective performance conditions implemented by the condition block 260 (and other condition blocks of the other PMON/COUNTERS 254) are met. For example, the processor 270 can employ the counter while executing instructions corresponding to a diagnostic utility. The value of the counter 266 can also be employed to control operation of one or more of the PMON/COUNTERS 254.

Figure 7:
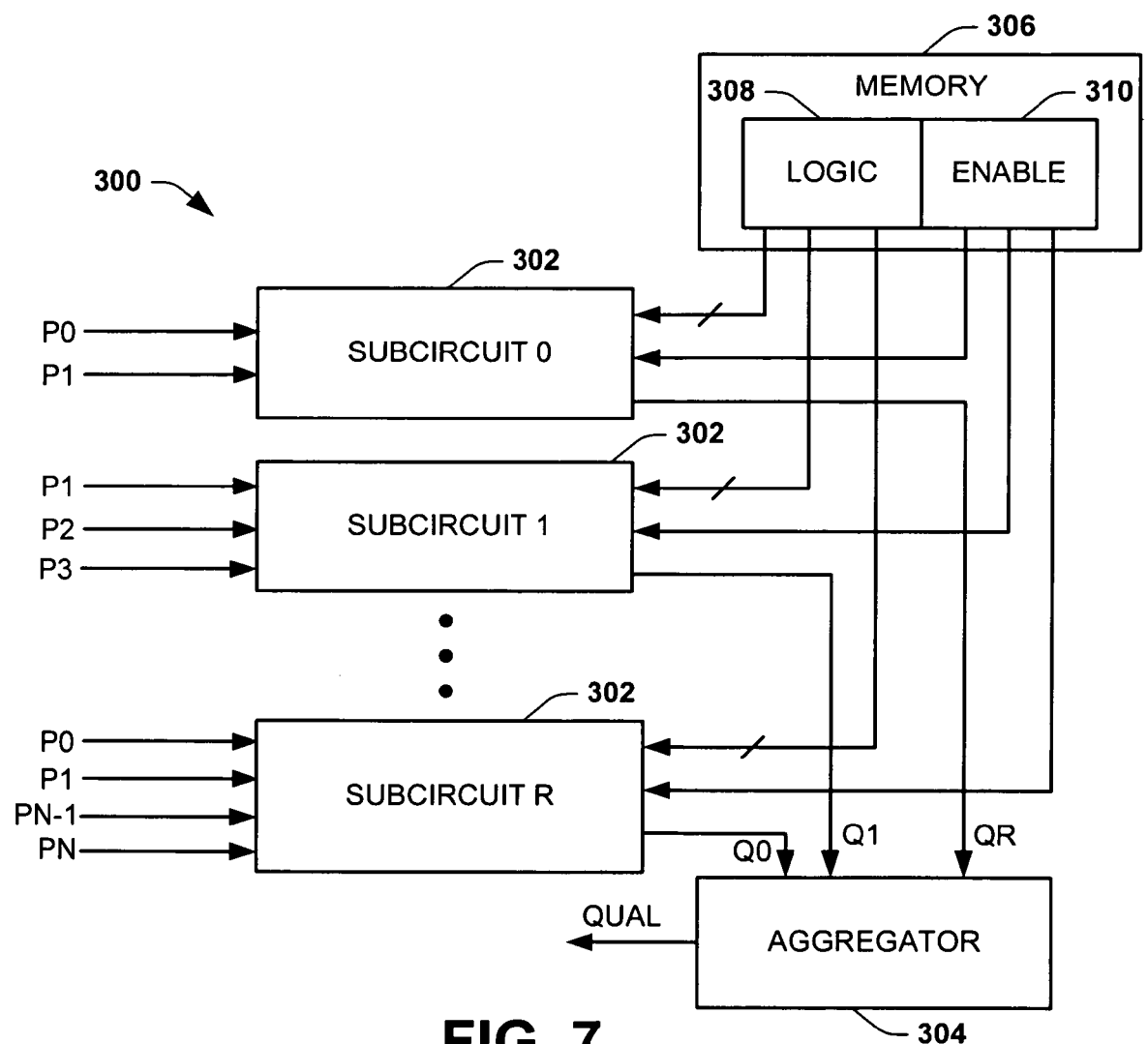
FIG. 7 depicts an embodiment of a system to qualify data capture.

FIG. 7 depicts an example of a qualification system that can be implemented in a logic analysis system. The qualification system includes a plurality of separate subcircuits 302. For example, the subcircuits 302 can be Boolean subcircuits: Boolean subcircuit 0, Boolean subcircuit 1 through Boolean subcircuit P, where P is a positive integer and R−1 denotes the number of subcircuits. Each of the subcircuits 302 is operative to provide a corresponding qualification signal, indicated at Q0, Q1 and QR, as a function of corresponding input signals, indicated generally at P0 through PN, where N−1 denotes the number of signals. R and N may be the same or different. The signals P0–PN can define variables for purposes of the Boolean operations performed by each of the subcircuits 302. As described herein, the input signals P0–PN to the qualification system 300 can represent values (e.g., one or more bits) of respective performance conditions for data on an associated bus.

It will be appreciated that one or more of the same signals P0–PN can be qualified by more than one of subcircuits 302 concurrently. This affords an increased set of possible Boolean operations that can be performed by the qualification system 300 over the set of variables corresponding to signals P0–PN. For example, since more than one of the signals (e.g., P0 and P1) are provided to different subcircuits, respective Boolean operations can be performed concurrently the signals and on the compliment (or inverse) of such signals. For those signals that occur only a single time as inputs to the qualification system 300, Boolean operations can be performed on either each of the signals or the compliment (or inverse) of the signals.

By way of example, each of subcircuits 302 can perform a corresponding Boolean operation by performing matching between predefined data and the variables defined by the input signals that are provided to the respective subcircuit. Thus, the qualification signals Q0, Q1 through QR vary as a function of the Boolean operation performed by each of the subcircuits on the respective variables. An aggregator 304 aggregates the qualification signals Q0, Q1 through QR to provide a corresponding aggregate qualification signal, indicated at QUAL. The QUAL signal can be a single bit or a multi-bit value that varies based on the respective qualification signals Q0, Q1 through QR.

Memory 306 can also be provided to set or configure the qualification system 300. For example, the memory 306 can be implemented as system addressable memory (e.g., an array of control and status registers). The memory 306 can be programmed to set logic data 308 that defines Boolean operations performed by the subcircuits 302 on the respective variables defined by the corresponding input signals P0–PN. As an example, the logic data 308 can correspond to a vector of logic values for masking the respective input signals provided to each of the subcircuits 302. The logic data 308 thus can be set to determine whether the values of the respective input signals match predetermined logic values, as stored as logic data in the memory 306.

The memory 306 can also include enable data 310 to selectively enable each of the plurality of subcircuits 302. The enable data 310 thus can be set for each of the subcircuits 302 to enable or disable the subcircuit to control whether a predetermined Boolean operation is performed relative to a selected subset of some or all of the input signals P0–PN. The Boolean operations implemented by the subcircuits 302 can be fixed for a data capture session by programming the logic data 308 and the enable data 310 for qualifying data capture over a plurality of cycles. Alternatively, the memory 306 can be reprogrammed during a capture session, such as to vary the Boolean functions performed by the subcircuits 302 over time. If the logic data 308 or the enable data 310 are to be reprogrammed during a capture session, the process should be configured to accommodate the time for re-programming the memory 306.

The memory 306 can be programmed, for example, by employing a system processor to address corresponding memory address locations associated with the logic data 308 or the enable data 310 that is to be programmed. Those skilled in the art will understand and appreciate other ways to program the memory 306, which can include but are not limited to configuration utilities (e.g., via a serial or JTAG interface communicatively coupled to the memory) or by other configuration tools or by scan-on-the-fly.

Figure 8:
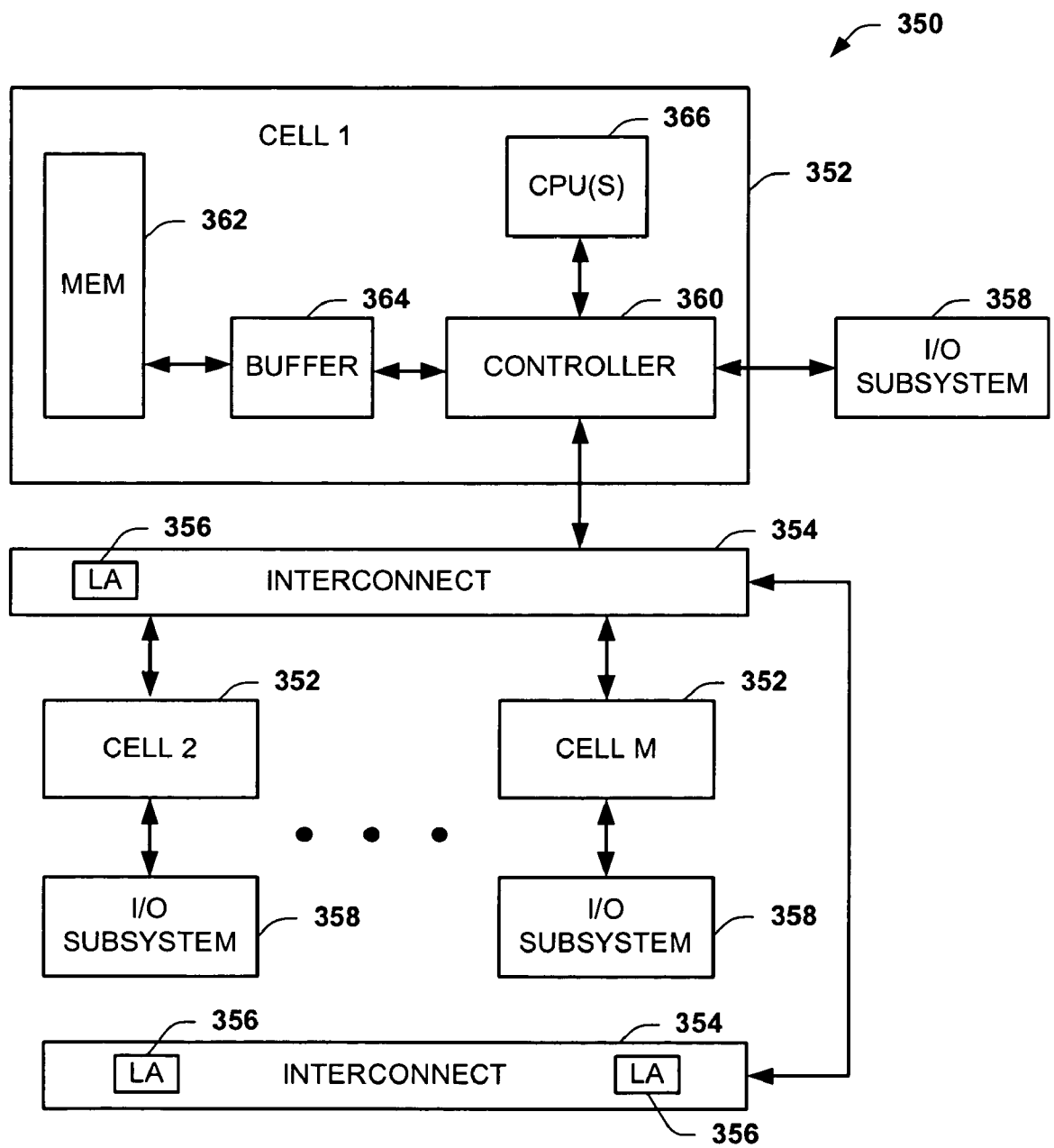
FIG. 8 depicts an example of a computer system that can implement one or more embodiments of a logic analysis system.

FIG. 8 depicts a block diagram illustrating an example of a computer system 350, which can implement one or more logic analyzer systems, such as including systems and components shown and described herein (e.g., FIGS. 1–7 and 9). The computer system 350 of FIG. 8 is depicted as a distributed-memory multi-processor system, although a single processor system can also utilize the logic analyzer. The system 350 includes a plurality of cells 352 indicated respectively at CELL 1, CELL 2 through CELL M, where M is an integer greater than or equal to one denoting the number of cells. Each of the cells 352, which can be implemented as a cell board, is communicatively coupled to other cells via an interconnect 354, such as a backplane or crossbar structure. The interconnects 354 can be implemented as an application specific integrated circuit (ASIC).

In the example, of FIG. 8, logic analyzers 356 are implemented within the interconnects 354; namely, one logic analyzer in a first interconnect and two logic analyzers in another interconnect. Those skilled in the art will understand and appreciate that any number of one or more logic analyzers can be implemented within the interconnects 354 as well as in other circuitry, including on integrated circuits in the cells 352 or I/O subsystems 358. By way of example, each logic analyzer 356 is coupled to a bus structure (e.g., an observability bus) that can be driven with data from components within one or more cells 352. Additionally, as described herein, each logic analyzer 356 can include memory addressable within the system 350, which can be read from or written two by components on any of the associated cells 352.

By way of further example, an I/O (input/output) subsystem 358 is associated with each of the cells 352. The I/O subsystem 358 can provide an interface or pathway for accessing an associated bus structure (e.g., a PCI bus structure) or other devices coupled to the corresponding bus structure, such as through corresponding adapter (not shown). Those skilled in the art will understand and appreciate various types of I/O devices 358 that can be accessed or can access memory via the I/O subsystem 358.

Additionally, the interconnect 354 that contains one logic analyzer 356 can be coupled to the other interconnect, which contains two logic analyzers, for accessing another cell-based architecture that includes one or more other cells (not shown). The other cell-based architecture can be similarly configured to that shown and described in FIG. 8. Those skilled in the art will understand and appreciate that the system 350, however, can be implemented with any number of cells, with any number of one or more logic analyzers being implemented.

For purposes of brevity, the internal contents are shown only for CELL 1, although those skilled in the art will understand and appreciate that each of the other respective cells 352 can be implemented in a similar manner. Alternatively, different configurations could also be implemented relative to the different cells 352.

Turning to the contents of CELL 1, CELL 1 includes a cell controller 360 coupled to a cell memory subsystem 362 through an associated buffer network 364. The buffer network 364 can include a queue (e.g., an input queue and an output queue) to provide intelligent buffering of requests and responses between the memory subsystem 362 and controller 360. One or more central processing units (CPUs) 366 are also connected to the controller 360 for accessing the memory subsystem 362. Each of the CPUs 366 can include an associated cache (not shown) for storing data for local access by the CPU without requiring access to the memory subsystem 362. In the arrangement shown in FIG. 8, the CPUs 366 and the I/O subsystem 356 each can be considered memory accessing devices operative to access data in the memory subsystem 362 via the controller 360. The controller 360 can include firmware, a configuration and status register (CSR) and an ordered access queue for accessing the data in the memory subsystem 362. The memory subsystem 362 can include any number of one or more memory modules, including one or more DIMM or SIMM memory devices.

When data is accessed by CPUs 366 and/or the I/O subsystem 356, the controller or other structures can drive selected portions or all of such data to the observability bus that is associated with one or more of the logic analyzers 356. The logic analyzers 356 can, in turn, monitor the data on the associated observability bus, qualify data based on the monitoring and capture data based on the qualification of the data. The logic analyzer further can implement a state machine that includes one or more conditions that control state transitions and how a given data capture session proceeds, such as described herein. It will be further appreciated that a data capture session for one or more of the logic analyzers 356 can be initiated and controlled programmatically by computer executable instructions running in one or more of the CPUs 366. Alternatively or additionally, a capture session can be initiated and controlled by a utility or a diagnostic tool. The utility or diagnostic tools, for example, can be run internally within a CPU 366 or externally as part of one of the I/O subsystems 358. Those skilled in the art will understand and appreciate various implementations of logic analyzers that can be employed in the computer system 350 based on the teachings contained herein.

Figure 9:
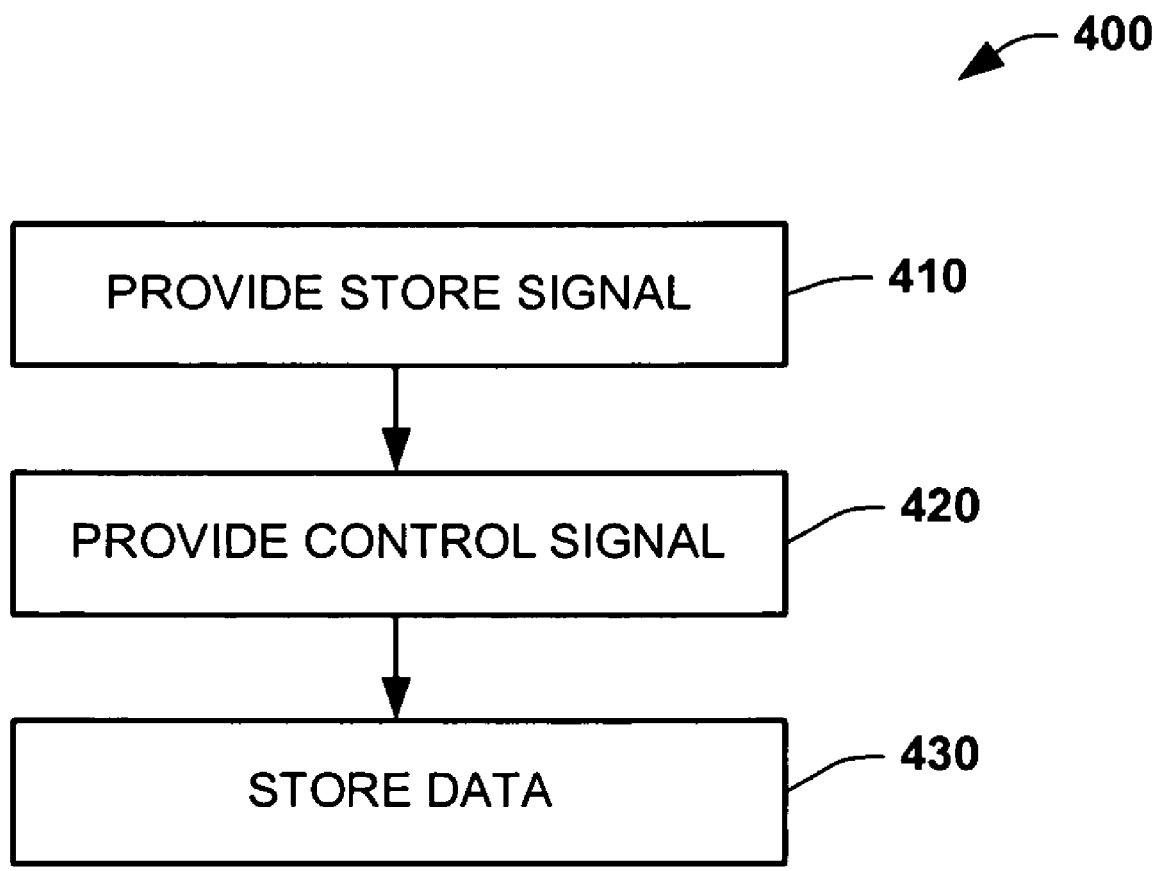
FIG. 9 is a flow diagram depicting an embodiment of a method for controlling data capture.

In view of the foregoing structural and functional features described above, certain method will be better appreciated with reference to FIG. 9. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., logic gates, such as including transistors, a digital signal processor, or application specific integrated circuit), software (e.g., as executable instructions running on one or more processors), or any combination of hardware and software.

FIG. 9 depicts an example of a method 400. The method 400 includes providing a store signal to indicate a qualified store cycle associated with storing data from an associated data source, as shown at 410. At 420, a control signal is provided based on a number of store cycles indicated by the stored signal relative to an occurrence of an event, the control signal being provided to define a capture session. At 430, data from the associated data source is captured in response to the store signal for storing a set of data based on the control signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, any number of one or more systems for controlling capture of data can be implemented in a given ASIC and any number of such ASICs can be integrated into a computer system, a router or other type of electrical and computer system. Accordingly, the present invention is intended to embrace all such alterations, modifications, and variations that fall within the spirit and scope of the appended claims.

What is claimed is:

1. A system comprising:
   a data capture system that stores a set of data from an associated data source in response to a store signal while enabled based on a control signal; and
   a control system that provides the control signal based on a number of store cycles relative to an event to define the set of data, the number of store cycles varying based on the store signal.

2. The system of claim 1, further comprising a counter having a value that varies as a function of the store signal, the control system providing the control signal based on the counter value.

3. The system of claim 2, wherein, after receiving an event signal indicating an occurrence of the event, the counter one of increments or decrements the counter value in response to each store cycle indicated by the store signal.

4. The system of claim 2, further comprising a comparator that compares the counter value relative to a predetermined value, the control system providing the control signal based on the comparison.

5. The system of claim 4, further comprising memory that is programmable to store the predetermined value to define the set of data as a time slice of data relative to the occurrence of the event.

6. The system of claim 1, wherein the associated data source further comprises an associated data bus, at least one of the store signal and the event signal being provided based at least in part on data from the associated data bus.

7. An on-chip logic analyzer comprising the system of claim 1, the logic analyzer further comprising:
   a qualification system that provides the store signal by qualifying data for a given store cycle as a function of data from the associated data source for data capture; and
   an analysis system that provides the event signal based on logic analysis performed based on the data from the associated data source.

8. The on-chip logic analyzer of claim 7, further comprising a monitoring system that provides a plurality of signals, each of the plurality of signals having a value that varies as a function of performance of corresponding data from the associated data source, at least one of the qualification system and the analysis system being responsive to the plurality of signals.

9. The on-chip logic analyzer of claim 8, wherein the data source further comprises an associated data bus, the monitoring system providing the plurality of signals based on the data on the associated data bus.

10. The on-chip logic analyzer of claim 8, wherein the monitoring system further comprises a plurality of performance monitoring subsystems, each of the plurality of performance monitoring subsystems providing a condition signal according to a measure of performance monitored by each respective one of the plurality of performance monitoring subsystems each data cycle, the analysis system providing the event signal based on at least a portion of the condition signals, and the qualification system providing the store signal based on at least a portion of the condition signals indicating a qualified store cycle.

11. The on-chip logic analyzer of claim 8, wherein the qualification system further comprises a plurality of subcircuits, each of the plurality of subcircuits qualifying data from the associated data source by performing a respective operation on the at least a portion of the plurality of signals, the store signal being provided according to the respective operations performed by the plurality of subcircuits.

12. The on-chip logic analyzer of claim 7, wherein the analysis system further comprises a state machine that transitions among a plurality of states and provides the event signal based on transitioning to at least one of the plurality of states in response to at least a portion of the plurality of signals.

13. An integrated circuit comprising the on-chip logic analyzer of claim 7, the integrated circuit further comprising addressable memory that is programmable with program data that controls at least one of the control system, the data capture system, the qualification system and the analysis system.

14. A computer system comprising the integrated circuit of claim 13, the computer system comprising at least one processor that is operative to program the addressable memory with the program data.

15. An integrated system to control storing data, the system comprising:
  a qualification system that provides a store signal associated with each store cycle as a function of qualifying data on an associated bus;
  an analysis system that provides an event signal based on performing logic analysis relative to data on the associated bus;
  a control system that provides a control signal based the store signal and the event signal to define a set of data over a plurality of store cycles; and
  a data capture system that stores the set of data from the associated bus based on the store signal and the control signal.

16. The system of claim 15, wherein the control system further comprises a counter having a value that varies as a function of each of the plurality of store cycles, the control system providing the control signal based on the counter value.

17. The system of claim 16, wherein the counter one of increments or decrements the counter value after an occurrence of the event in response to each store cycle indicated by the store signal.

18. The system of claim 16, wherein the control system provides the control signal based on the counter value relative to a predetermined value.

19. The system of claim 18, further comprising:
  memory that is programmable to store the predetermined value to define the set of data as a time slice of data relative to the occurrence of the event; and
  a comparator that compares the counter value relative to the predetermined value, the control system providing the control signal based on the comparison.

20. The system of claim 15, a monitoring system that provides a plurality of signals, each of the plurality of signals having a value that varies as a function of at least one performance condition of corresponding data provided on the associated bus.

21. The system of claim 20, wherein the qualification system is programmable to qualify the data by performing at least one of a matching operation, an arithmetic function and a Boolean function on the plurality of signals.

22. The system of claim 20, wherein the monitoring system further comprises a plurality of performance monitoring subsystems, each of the plurality of performance monitoring subsystems providing a condition signal according to a measure of performance monitored by each of the respective plurality of performance monitoring subsystems, the analysis system providing the event signal based on at least a portion of the condition signals, and the qualification system providing the store signal based on at least some of the condition signals indicating a qualified store cycle.

23. The system of claim 20, wherein the analysis system further comprises a state machine that transitions among a plurality of states and provides the event signal based on transitioning to at least one of the plurality of states in response to at least a portion of the plurality of signals.

24. The system of claim 20, further comprising memory that stores program data for programming at least one of the qualification system, the analysis system and the monitoring system.

25. The system of claim 15, wherein data capture system further comprises a capture depth component that controls a depth into the associated bus from which data is captured for a given store cycle.

26. A computer system comprising at least one integrated system according to claim 15, the computer system further comprising at least one processor that is operative to program memory that defines how the at least one integrated system captures data during a capture session.

27. A system comprising:
  means for providing a store signal that indicates a qualified store cycle for storing data from an associated data source;
  means for providing a control signal based on a number of store cycles relative to an occurrence of an event, the control signal defining a set of data; and
  means for storing data from the associated data source each qualified store cycle in response to the store signal while enabled based on the control signal, such that the set of data is stored.

28. The system of claim 27, further comprising means for counting store cycles based on the store signal, the means for providing the control signal provides the control signal based on the counted number of store cycles relative to a predetermined value.

29. The system of claim 27, further comprising memory that is programmable to set the predetermined value for defining the set of data as a time slice of data relative to the occurrence of the event.

30. The system of claim 27, wherein the associated data source further comprises an associated data bus, at least one of the store signal and the event signal being provided based at least in part on data on the associated data bus.

31. The system of claim 30, further comprising:
  means for providing a plurality of signals indicative of corresponding performance conditions associated with the data on the associated data bus;
  means for qualifying storage of the data from the associated data bus as a function of the plurality of signals and for providing the store signal to indicate whether the data has been qualified for storage.

32. The system of claim 27, further comprising means for programming the system for storing the set of data for a capture session.

33. A method comprising:
  providing a store signal to indicate a qualified store cycle associated with storing data from an associated data source;

providing a control signal based on a number of store cycles indicated by the stored signal relative to an occurrence of an event, the control signal being provided to define a capture session; and capturing data from the associated data source in response to the store signal for storing a set of data based on the control signal.

34. The method of claim 33, wherein the associated data source comprises an associated bus, the method further comprising:

monitoring performance of data on the associated bus and providing at least one signal indicative of at least one performance condition associated with corresponding data on the associated bus;

analyzing the corresponding data on the associated bus based on the at least one signal; and providing a trigger signal based on the analysis of the corresponding data on the associated bus indicating the occurrence of the event, the control signal being provided based on the number of store cycles indicated by the stored signal and based on the trigger signal.

35. The method of claim 34, further comprising qualifying data for storage from the associated bus as a function of the at least one signal, the store signal being provided based on the qualification of data indicating a qualified store cycle.

36. The method of claim 34, wherein the at least one signal further comprises a plurality of signals, the analyzing further comprises transitioning among a plurality of states as a function of the plurality of signals, the trigger signal being provided based on transitioning to at least one final state of the plurality of states.

37. The method of claim 33, further comprising counting the number of store cycles based on the store signal, the control signal being provided based the counted number of store cycles relative to a predetermined value.

* * * * *